United States Patent
Colbert et al.

(10) Patent No.: US 6,449,155 B1
(45) Date of Patent: Sep. 10, 2002

(54) LAND GRID ARRAY SUBASSEMBLY FOR MULTICHIP MODULES

(75) Inventors: John Lee Colbert, Byron, MN (US); John Saunders Corbin, Jr., Austin, TX (US); Roger Duane Hamilton, Eyota, MN (US); Danny E. Massey, Austin, TX (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/927,056

(22) Filed: Aug. 9, 2001

(51) Int. Cl.[7] .................................................. H05K 7/20
(52) U.S. Cl. .................. 361/704; 361/707; 361/709; 361/712; 361/715; 361/718; 165/80.2; 165/80.3; 165/185; 174/16.3; 257/718; 257/719
(58) Field of Search .................. 361/704, 690–695, 361/718–720; 257/706, 718, 727; 174/15.1, 16.3; 165/80.3, 185

(56) References Cited

U.S. PATENT DOCUMENTS

| | | | |
|---|---|---|---|
| 5,473,510 A | * 12/1995 | Dozier, II | 361/719 |
| 5,648,893 A | * 7/1997 | Loo et al. | 361/820 |
| 5,703,753 A | * 12/1997 | Mok | 361/715 |
| 5,724,229 A | * 3/1998 | Tustaniwskyi et al. | 361/719 |
| 5,793,618 A | * 8/1998 | Chan et al. | 361/809 |
| 5,917,703 A | * 6/1999 | Murphy | 361/704 |
| 6,061,235 A | * 5/2000 | Cromwell et al. | 361/690 |
| 6,198,630 B1 | * 3/2001 | Cromwell | 361/704 |
| 6,282,093 B1 | * 8/2001 | Goodwin | 361/704 |

* cited by examiner

*Primary Examiner*—Boris Chervinsky
(74) *Attorney, Agent, or Firm*—Karuna Ojanen (57) ABSTRACT

A multichip module subassembly is disclosed which provides for a heatsink, a thermal interface, a module cap upon which a multichip module is mounted, a land grid array interposer, and an assembly cover. The module cap has shimmed load posts and adjustable brackets for precise alignment and loading of the interposer onto the module. The cover may have a springplate for precise preloading of the interposer onto the multichip module for transportation. The multichip module subassembly is easily used as a field replaceable unit.

14 Claims, 6 Drawing Sheets

LAND GRID ARRAY SUBASSEMBLY FOR MULTICHIP MODULES

FIELD OF THE INVENTION

This invention relates generally to the field of multichip modules of integrated circuits, and more particularly relates to a field replaceable unit of a multichip module having land grid array interconnections.

BACKGROUND OF THE INVENTION

In the world of integrated circuits, there are a multitude of electrical connections between the integrated circuits of an electronic device such as a computer processor and other integrated circuits within the processor and eventually to the "outside world." As integrated circuits become more dense so must the electrical connections. Integrated circuits are mounted on printed circuit boards and may be connected to other circuits by traces embedded in a printed circuit board. These traces are interconnected with vias/microvias which allows connection of one trace on one circuit-board layer to a trace on a different layer. Varying and controlling the physics of each connection by controlling the dielectric used, the dielectric thickness, and the signal-path area of and within each layer can result in a specific, controlled characteristic impedance. These vias/microvias, however, degrade the continuity of a signal path by introducing variations in the electrical qualities of the signal transmnission.

There are a myriad of options to provide the electrical connections to/from integrated circuits with these considerations incorporated into the design. Some of the options include various small outline packages, plastic leaded chip carrier, dual inline packages, pin grid arrays, ball grid arrays, etc. The next generation of integrated circuits, such as a system-on-chip and other high density devices, however, require high density electrical interconnections. While these fine, high density circuit traces increase the density of a interconnect they also increase the inductance, resistance, and current-carrying ability of the interconnect. Previous packaging options, like pin grid arrays and quad flat packs all left something to be desired in accommodating the dense new technology of printed-wiring boards with trace widths as small as or even smaller than 0.003 inch. Even the ball grid array is not an option with high-end printed circuit boards requiring 1000 and more pin counts because the large footprints can not stand the forces on the solder joints that are caused by thermal mismatch, i.e., the materials of the semiconductor device have different coefficients of thermal expansion than those of the target printed circuit board. Thus, high-speed, high-density circuit boards are difficult to design, have exacting requirements, and are expensive to manufacture.

Area array socket connectors are an evolving technology in which an interconnection between mating surfaces is provided through a conductive interposer. One significant application of this technology is the socketing of land grid array (LGA) modules directly to a printed wiring board in which the electrical connection is achieved by aligning the contact array of the two mating surfaces and the interposer, and mechanically compressing the interposer. The advantages of LGA socket connectors include: the capability to upgrade electronics in the field; flexibility in starting up and diagnosing an electronic system; reduction of cost required to rework the previously assembly board; reduction of mismatch between the coefficients of thermal expansion between the module and the board; improvement of electrical performance; and the compactness and low profile of the electrical connector designs. Although not technically accurate, the easiest way to envision an LGA device is to picture a semiconductor with nothing but tiny round gold plated pads on the bottom whereas if the device were a ball grid array, a ball would be soldered to each pad. The biggest reason for terminating a device as an LGA is to achieve higher pin counts, i.e., number of outputs, with smaller packages. The "z-axis" connection configuration of a LGA, moreover, can overcome the thermal mismatch problems described above with respect to the ball grid arrays. In short, the LGA offers a viable interconnection for high speed, high density integrated circuits.

At a pitch of, e.g., one millimeter, a LGA has 1,225 interconnections in a 35×35 grid that is less than 1.5 square inches and 2,025 interconnections in a 45×45 grid that is less than 1.75 square inches. LGAs are easier and cheaper to manufacture because terminations such as pins or balls are no longer required. Land grid arrays have low inductance because the distance from the bottom of the device being socketed to the target board can be less than two millimeters with some LGA socket designs thus minimizing the electrical path of each connection. Co-planarity problems are eliminated because LGA sockets can be manufactured for spring movement of 0.015" (0.4 mm), which "takes up the slack" when there is a problem with co-planarity on the bottom of the device.

Almost all LGA interconnections require use of mechanical elements that apply a controlled load to LGA connector elements. Examples of these mechanical elements include an interposer or socket component; something that possesses the specific LGA pattern of exposed contacts on top and bottom faces of the connector and mates to corresponding module and board surfaces to be interconnected. To ensure reliable LGA interconnection performance, both contact members in the interposer and mating surfaces of boards and module LGA contact pads must possess a noble surface finish that is both resistant to corrosion and provides low contact resistance within the contact load range necessary for mating of the connector. To provide these attributes on printed circuit boards, the surface of LGA contact pads may be plated with a nickel or gold or palladium or a combination thereof (Ni/Au/Pd). In many applications, including some backplane applications, these surfaces may be plated by selective deposition of electrolytic Ni/Au platings as opposed to use of electroless or immersion platings.

There are various type of LGA interposers, among them being the CINCH interposer which is based on fuzz button technology to provide a high-speed, Z-axis, compression mount interconnect which has a very low profile interconnect. The compressed signal path length may be as short as 0.8 millimeter to enable transmission of frequencies greater than 1 giga-Hertz. Palladium or gold plated molybdenum wire is randomly wound to form an individual contact which can be spaced one millimeter on center or greater, and which may be mounted in a plastic molded frame. Another LGA interposer is the TYCO metal particle interconnect technology, in which silver-filled elastomeric contacts are molded onto and through a KAPTON carrier which is staked onto a plastic frame. Yet a third type of LGA interposer is the cLGA product from Intercon in which C-shaped clips are individually inserted into cavities molded in a plastic frame.

LGA socket assemblies are prevalent today in the electronics industry, but are typically used to attach single-chip-modules to printed wiring boards. The demand for higher performance is driving a requirement to develop LGA socket applications for multichip modules to printed wiring boards.

SUMMARY OF THE INVENTION

Thus what has been disclosed herein is a land grid array, multichip module assembly comprising: a thermal transfer unit; an electronic multichip module; a module cap having shimmed load posts and adjustable brackets; a land grid array electrical connector to provide electrical interconnections to the electronic multichip module, wherein the land grid array is placed upon the adjustable brackets with the shimmed load posts providing a particular load to the electrical interconnections; and a protective cover.

The thermal thermal transfer unit may comprise a heat sink and a thermal interface between the heat sink and the module cap. The shimmed load posts are preferably positioned at several locations near a center of each dimension of the periphery of the module cap. The shimmed load posts may also be positioned above the surface of the module cap to provide a sufficient compression to the land grid array electrical connector. The protective cover may have a springplate to preload the land grid array electrical connector onto the multichip module during transit.

The invention may further be considered a field replaceable unit for a computer, comprising: a heat transfer element; an electronic multichip module, and a module cap upon which the electronic multichip module is attached, the module cap having shimmed load posts located at or near the center of each outer edge of the module cap; the module cap further comprising at least two adjustable mounting brackets located at opposite corners of the module cap for mounting a land grid array onto the electronic multichip module. The land grid array may be mounted onto the adjustable corner brackets while a protective cover may be mounted onto the shimmed load posts over the land grid array for use in transit. The land grid array may require preloading to protect its electrical interconnections, and therefore, the protective cover may further comprise a springplate to provide a sufficient compressive force for preloading.

The invention may also be considered a replaceable electronic assembly comprising: a means to dissipate heat; an electronic module having a plurality of integrated circuits; a means to mount a land grid array interposer onto the electronic module; a means to align the land grid array interposer onto the electronic module; means to apply a compressive load to the land grid array interposer mounted and aligned onto the electronic module; and a means to protect the replaceable electronic assembly. The means to mount the land grid array interposer onto the electronic module may comprise at least one alignment pin integral with the land grid array interposer to fit into at least one interposer alignment hole of a module cap in said alignment means. The mounting means may comprise at least one retaining clip to engage the alignment pin into the interposer alignment hole, which may be mounted on a right-angled bracket which in turn is mounted on the module cap. The means to align the land grid array interposer may comprise at least one right-angled bracket positioned on the module cap wherein the bracket can be adjusted along at least two dimensions for alignment of a plurality of electrical interconnections of the land grid array interposer onto a plurality of electrical interconnections of the electronic module. The means to apply a compressive load to the land grid array interposer mounted and aligned onto the electronic module may further comprise a plurality of shimmed load posts extending from the module cap upon which the electronic module is mounted. The means to protect the replaceable electronic assembly may further comprise a means to interconnect the heat transfer unit, the module cap, the electronic module, the land grid array interposer, and a removable cover into an integral unit. The means to protect the replaceable electronic assembly may also further comprise a springplate mounted onto the removable cover to apply a preload to the land grid array interposer.

DESCRIPTION OF THE INVENTION

Figure 1:
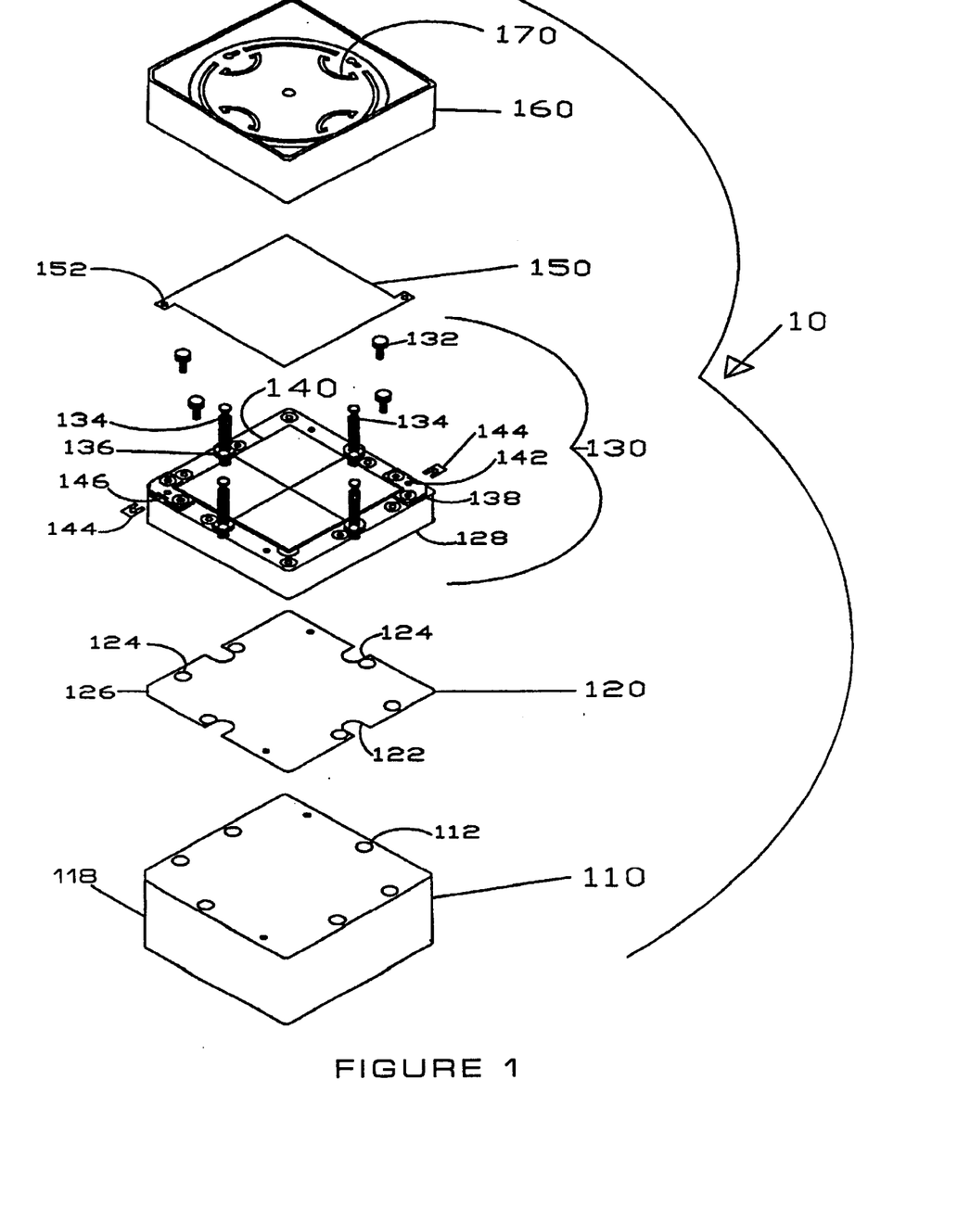
FIG. 1 is an exploded view of a field replaceable unit of a multichip module in accordance with an embodiment of the invention.

Referring now to the Drawing in which like features in the various figures are referred to by the same reference numeral, disclosed in FIG. 1 is an field replaceable unit (FRU) 10 that integrates a heatsink 110, a thermal subassembly or other thermal interface 120, a multichip module 130, an LGA interposer 150, and a protective cover 160. The field replaceable unit 10 of the invention herein is characterized by its LGA module and interposer registration, ease of manufacturing and transportation or other distribution, and ease of installation and removal in both manufacturing and field environments.

Figure 3A:
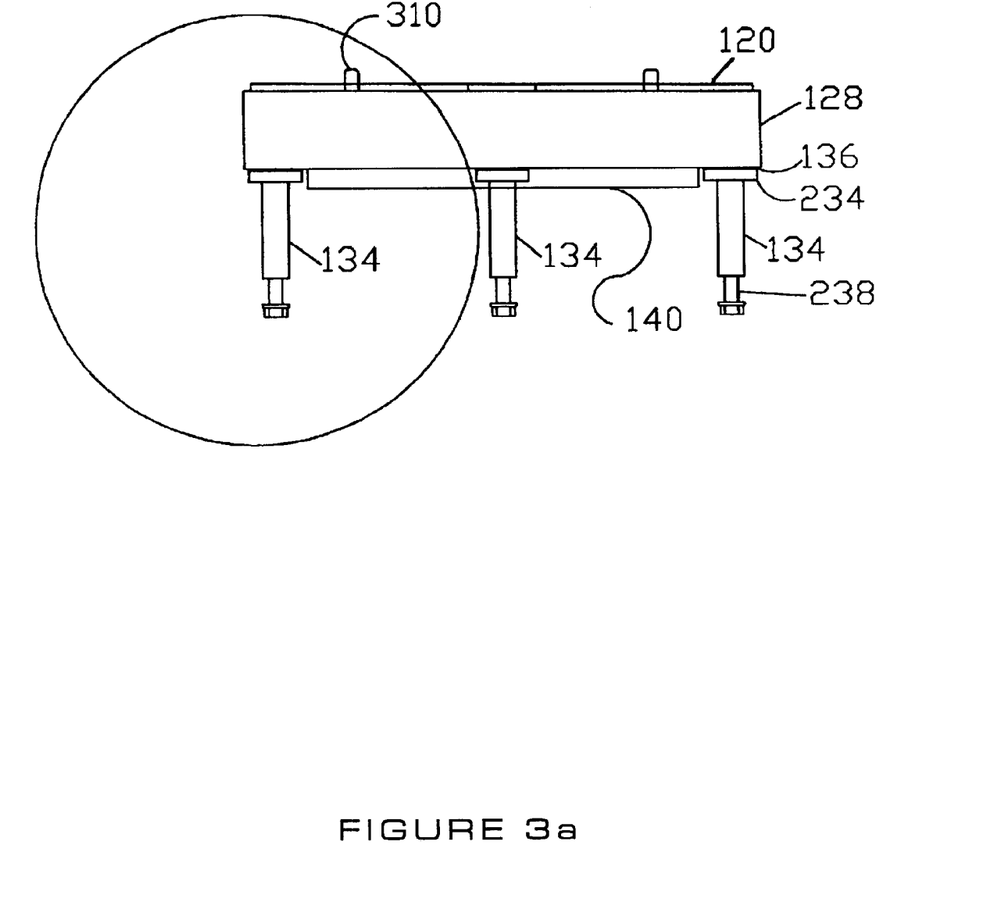
FIGS. 3a and 3b are detailed isometric views of the loading shims of the field replaceable unit illustrating additional features of the invention.
Figure 3B:
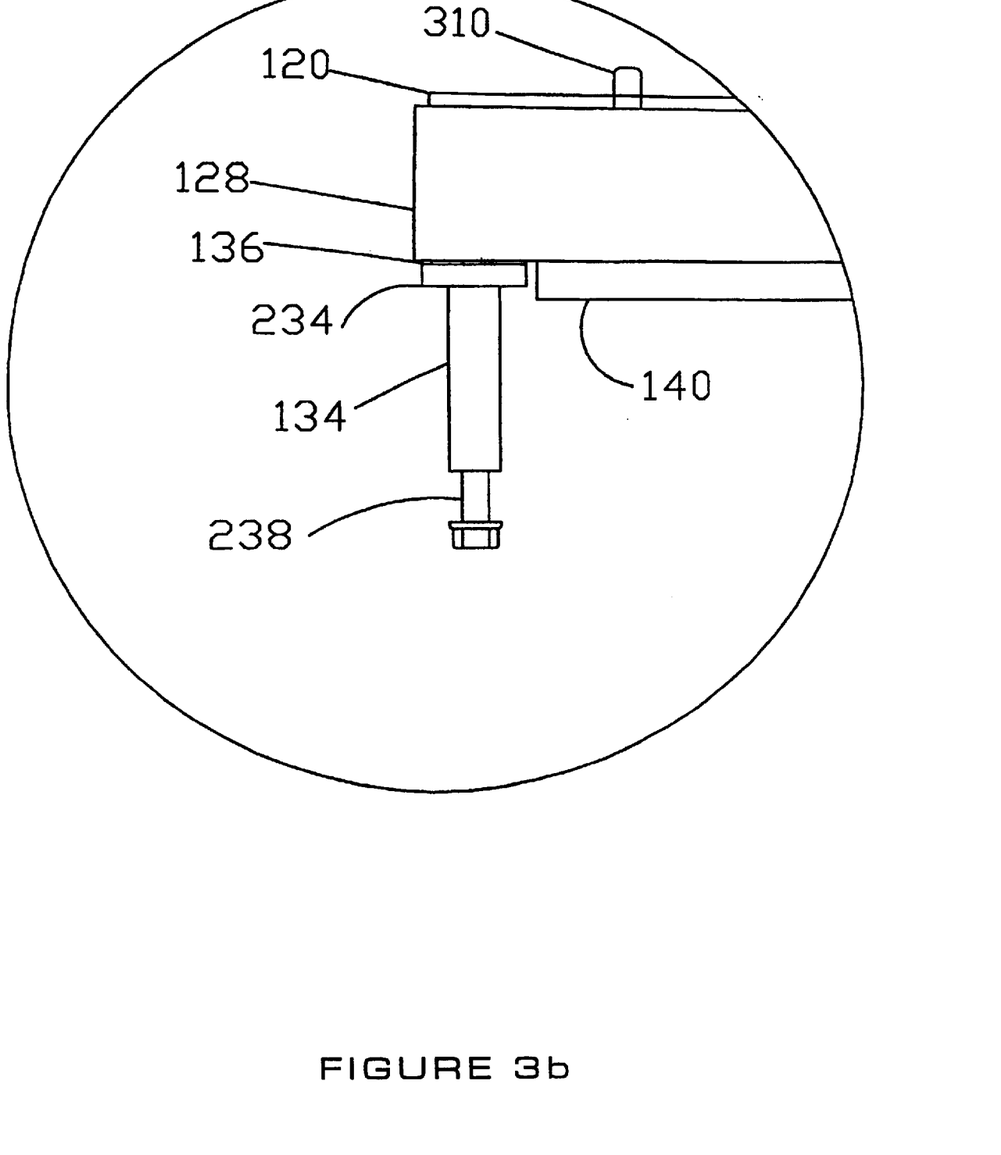

The field replaceable unit 10 is in the general shape of a quadrilateral although it need not be so. When viewed as a tower of components, each of the components are in the same geometric shape as and fit with the component above and below it; at one end and as illustrated in FIG. 1 is a heatsink 110 or other thermal transfer unit. Preferably, heatsink 110 is made from a thermal conductive material, examples of which include copper and aluminum. One corner 118 of the heatsink 110 and the corresponding corner of all the tower components are angled for easy visual alignment. In actual installation, however, the heatsink 110 will be on top, i.e., the order of top to bottom will be reversed. The heatsink has attachment holes 112 through which attachment screws 132 connect the module assembly 130. Attachment may be made from either side of the heatsink 110/module assembly 130 but preferably is made from the underside of the heatsink 110 engaging the module assembly on the plane opposite from which the load posts 134 extend. As can be seen in FIGS. 3a and 3b, the module assembly has short extending nubs 310 which mate with corresponding holes in the heatsink 110 for placement.

Returning to FIG. 1, between the heatsink 110 and the module cap 130 may be a thermal interface 120 such as thermal paste, oil, phase change material, or similar item, to enhance the thermal performance of the heatsink 110. Thermal interface 120 is relatively thin so that it may easily transfer heat away from the module assembly 130. If a solid material, the thermal interface 120 has corresponding cut outs 122 for the load posts 134, attachment holes 124, and an angled corner 126 for alignment onto the heatsink 110 and the module cap 130.

Figure 2:
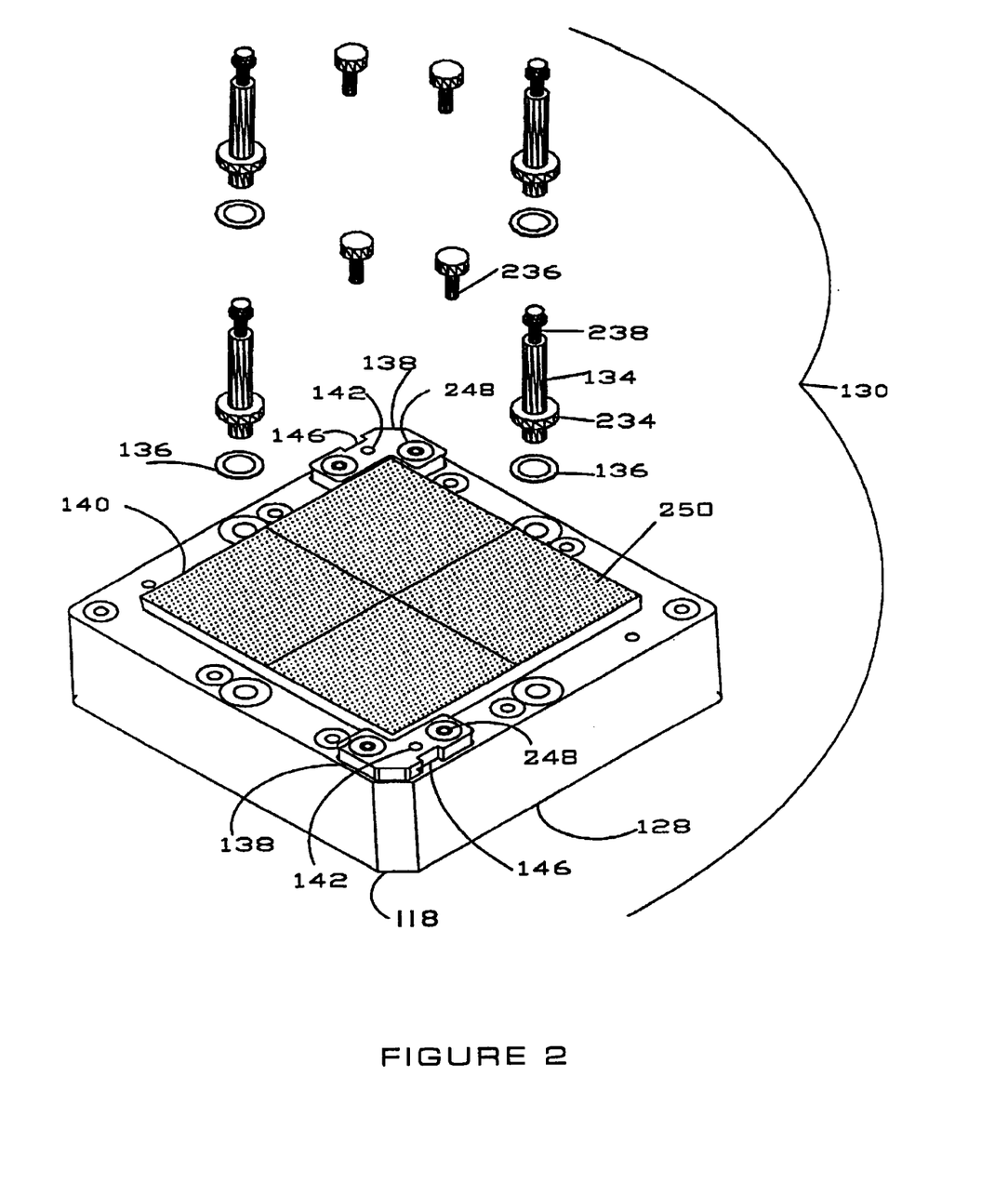
FIG. 2 is a detailed isometric view of the multichip module cap illustrating the load posts, the shims, and the brackets of the invention.

The module assembly 130 comprises a ceramic LGA multichip module substrate 140 attached to an overhanging cap 128, preferably with an adhesive layer, typically SYLGARD, although other types of adhesives and/or attachment mechanisms may be used. The overhanging cap 128 is more clearly shown in FIGS. 2, 3a, and 3b. The overhanging cap 128 of the module assembly is made from a thermally conductive material such as copper and provides many of the features necessary to implement the integral field replaceable unit 10.

Specifically, load posts 134 are preferably installed at each of the four midpoints along each edge of the perimeter of the overhanging cap 128. The location of the load posts 134 at the midside reduces the substrate and cap bending deflection when compared to corner load post locations. The load posts 134 transmit the actuation loads that compress the LGA interposer 150 to electrically mate with the multichip module 140. Shims 136 are installed under each load post shoulder 234 to accurately control the overall dimension from the LGA interposer 150 to the shoulder of each load post 134. The shims 136 provide overall dimensional consistency for the fixed displacement actuation hardware so the applied loads will be within expected limits. The load posts have an exactly machined shoulder 234 under which the shim 136 is position. Each load post 134 also has a retention groove 238 which can be used for placement and retention of a protective cover, as will be discussed.

Another critical feature on the overhanging cap 128 are at least two alignment/retention brackets 138. These alignment brackets are more dearly seen in FIG. 2. Each bracket 138 contains an interposer alignment hole 142 that mates to alignment pins 152 that extend through and become an integral part of the LGA interposer 150. The alignment/ retention brackets 138 are mounted to the overhanging cap 128 with screws 236 through elongated holes 248 near and on opposite corners. An important feature of the alignment/ retention brackets 138 is that they can be adjusted laterally in at least two dimensions. The position of the multichip module substrate 140 array varies with respect to the module cap 128 because of manufacturing tolerances. Therefore, to align the LGA interposer 150 to the multichip module substrate array 140, the alignment/retention brackets 138 are first loosely installed on the overhanging cap 128, and then a semi-transparent LGA interposer 150 is positioned onto the interposer alignment holes 142. Electrical interconnections 250 of the LGA interposer are optically aligned with the LGA array on the substrate 140, and the interposer/ retention bracket mounting screws 236 are tightened. For opaque LGA interposers such as CINCH, a glass master may be used to align the alignment/retention brackets 138 to the multichip module substrate 140.

Once optically aligned, the LGA interposer 150 is retained as an integral part of the field replaceable unit 10 using interposer retaining clips 144 shown in FIG. 1. The clips are slid through access holes 146 in the brackets 138 of the assembly cap 128 and engage retention grooves 238 in the end of each LGA interposer alignment pin 152. Another key feature of the invention herein is that the integral LGA interposer 150 facilitates installation and removal of the multichip module.

Figure 4:
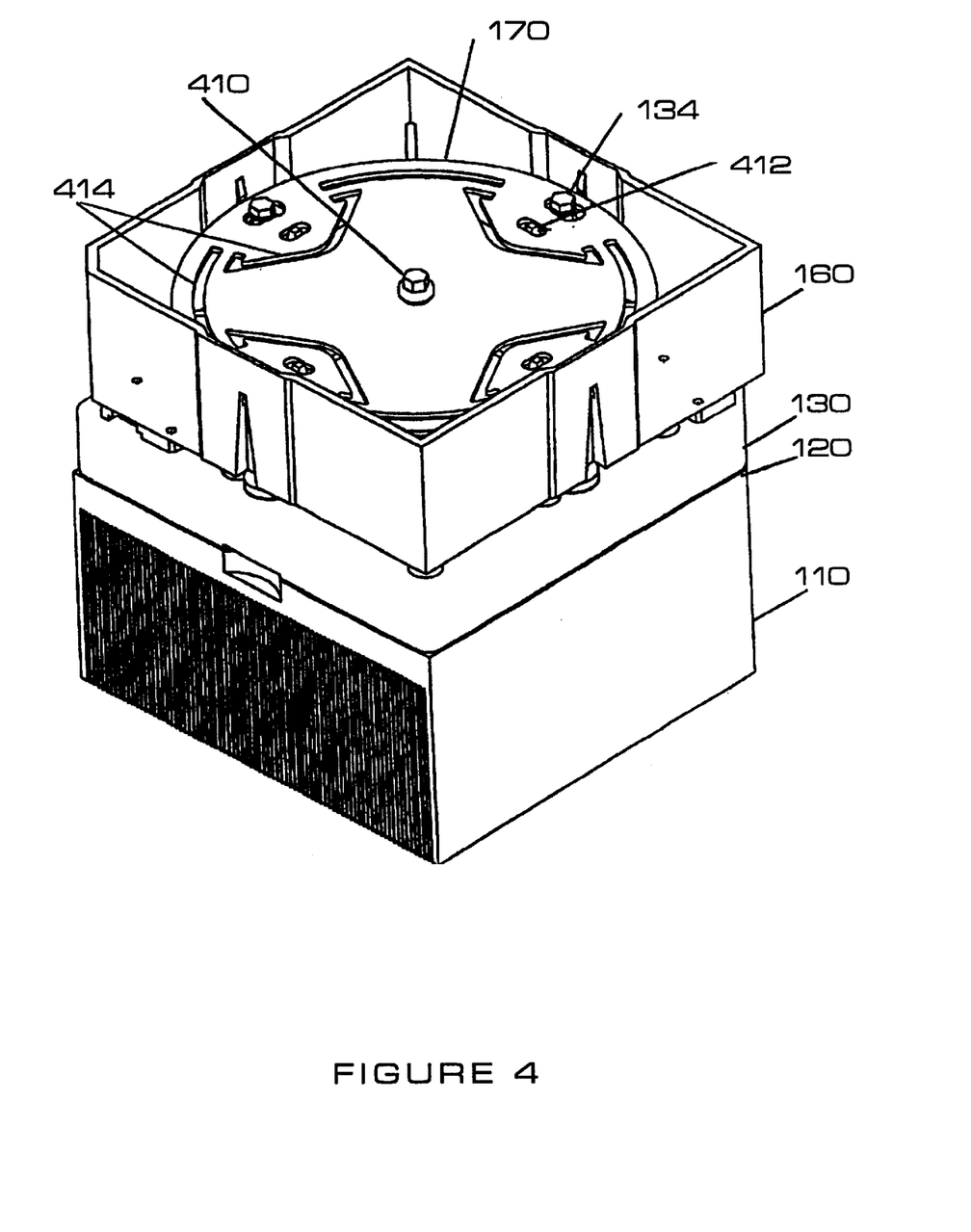
FIG. 4 is an isometric view of an assembled field replaceable unit in accordance with one embodiment of the invention. It is suggested that FIG. 4 be printed on the face of the patent.
Figure 5:
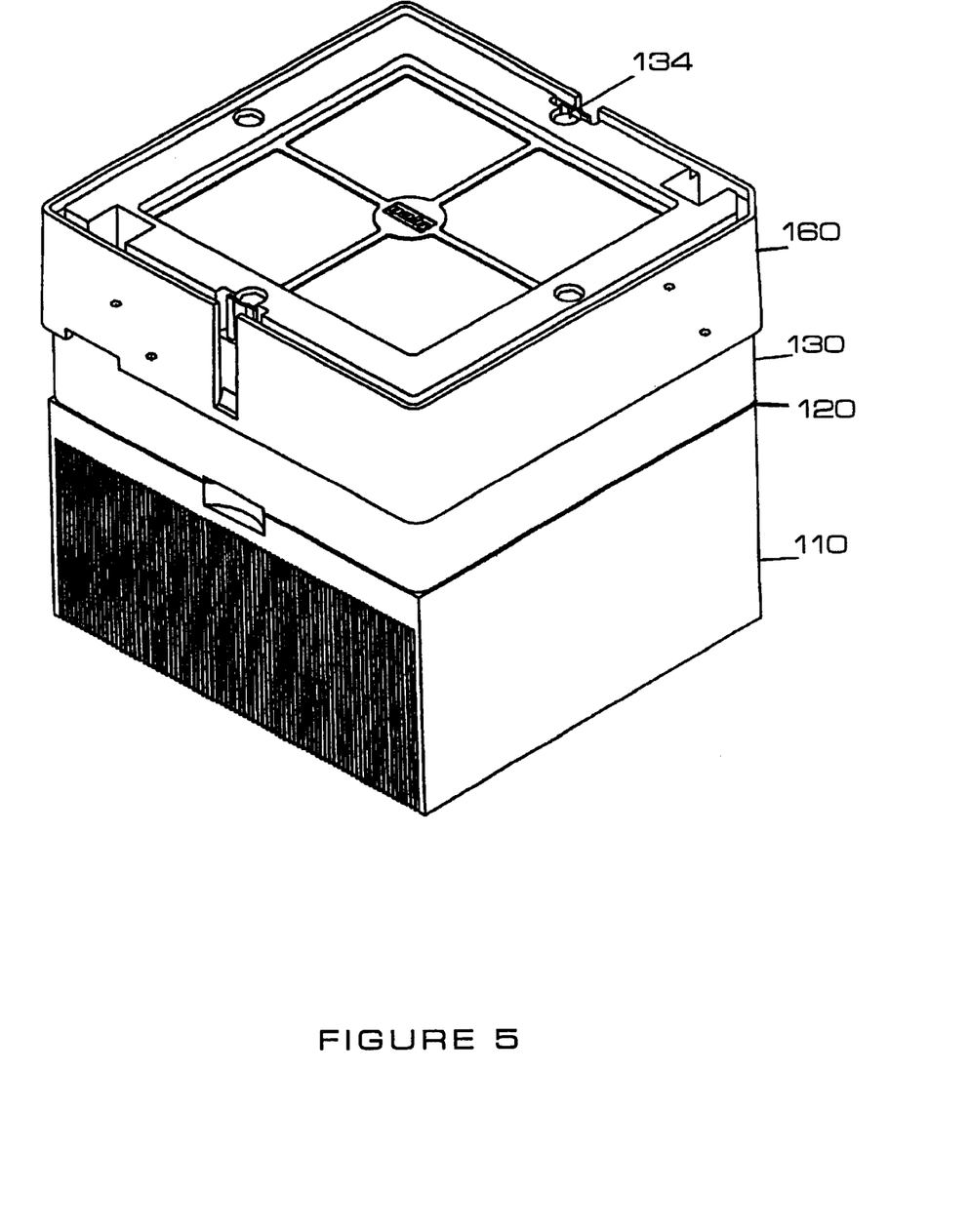
FIG. 5 is an isometric view of an assembled field replaceable unit in accordance with another embodiment of the invention.

The uninstalled multichip module/LGA field replaceable unit 10 also includes a protective cover 160 to protect the LGA interposer contacts from damage. Two protective cover designs are shown in FIGS. 4 and 5 as alternative embodiments, although other protective cover designs may be implemented. The protective cover is made from a dissipative material such as electrically static dissipative plastic. The first protective cover shown in FIG. 4 is for a CINCH LGA interposer or other LGA applications having more fragile electrical interconnections. The protective cover 160 contains a circular springplate 170 that engages retention grooves 238 on the end of each load post 134. The springplate is circular and has several arced and other openings 414 to provided a linear force deflection curve resulting in more uniform and tighter load control in the assembly. Small cutouts 414 on the springplate 170 engage small nubs 412 of the cover to facilitate placement. Once engaged, a threaded bushing 410 in the center of the springplate 170 can be actuated to preload the bottom of the protective cover against the LGA contacts in the interposer which prevent the contact buttons from shifting in or becoming dislodged from the molded cavities in the interposer. For TYCO LGA interposers, as shown in FIG. 5, a protective cover is a plastic cap that simply snaps onto the load posts. In either or any alternative embodiment, the protective cover is removed prior to installation of the field replaceable unit into the computer or other electronic unit.

Thus, the field replaceable unit incorporating features of the invention facilitates handling in manufacturing, transportation, distribution, and environments, as well as facilitating installation in both manufacturing and field environments. The use of the shimmed load posts gives dimensional control and therefore improved LGA load control after actuation. The midside load post location gives reduced substrate and cap bending deflection when compared to corner load post locations. The adjustable brackets enable precise alignment of LGA interposer to the multichip module substrate pad array. The capability to retain the LGA interposer and make it an integral part of the of the field replacement unit facilitates ease of removal and installation of a multichip module. A protective cover protects LGA interposer contacts, and for certain applications, such as for CINCH LGA interposers, the protective cover provides contact button preload to protect the fragile electrical interconnections.

While the invention has been described in connection with what is presently considered the most practical and preferred embodiments, it is to be understood that the invention is not limited to the disclosed embodiments but, on the contrary, is intended to cover various modifications and equivalent arrangements included within the spirit and scope of the appended claims.

What is claimed is:

1. A land grid array, multichip module assembly, comprising:
   (a) an electronic multichip module;
   (b) a thermal transfer unit in contact with the electronic multichip module;
   (c) a module cap having shimmed load posts and adjustable brackets upon which the electronic multichip module is mounted;
   (d) a land grid array interposer to provide electrical interconnections to the electronic multichip module, said land grid array interposer placed upon the adjustable brackets with the shimmed load posts providing a particular load to the electrical interconnections; and
   (e) a protective cover placed upon the land grid array interposer, wherein the thermal transfer unit, the multichip module, the land grid array interposer, and the protective cover are comprise a tower of components as a field replaceable unit.

2. The land grid array, multichip module assembly of claim 1, wherein the thermal transfer unit may comprise:
   (a) a heat sink, and
   (b) a thermal interface between the heat sink and the module cap.

3. The land grid array, multichip module assembly of claim 1, wherein the shimmed load posts are positioned at several locations near a center of each edge of the periphery of the module cap.

4. The land grid array, multichip module assembly of claim 3, wherein the shimmed load posts are positioned above the surface of the module cap to provide a sufficient compression to the land grid array interposer.

5. The land grid array, multichip module assembly of claim 3, wherein the protective cover further comprises:
   (a) a springplate to preload the land grid array interposer onto the multichip module during transit.

6. A field replaceable unit for a computer, comprising:
   (a) a heat transfer element;
   (b) an electronic multichip module, and
   (c) a module cap upon which the electronic multichip module is attached, the module cap having shimmed load posts located at or near the center of each outer edge of the module cap; the module cap further comprising at least two adjustable mounting brackets located at opposite comers of the module cap for mounting a land grid array interposer onto the electronic multichip module.

7. The field replaceable unit of claim 6, further comprising:
   (a) the land grid array interposer mounted onto the adjustable mounting brackets; and
   (b) a protective cover mounted onto the shimmed load posts over the land grid array interposer for use in transit.

8. The field replaceable unit of claim 7, wherein the land grid array interposer requires preload to protect a plurality of electrical interconnections, and the protective cover further comprises a springplate to provide a sufficient compressive force for preloading.

9. A replaceable electronic assembly comprising:
   (a) means to dissipate heat;
   (b) an electronic module;
   (c) means to mount a land grid array interposer onto the electronic module;
   (d) means to align the land grid array interposer onto the electronic module comprising at least one right-angled bracket positioned on a module cap wherein the bracket can be adjusted along at least two dimensions for precise alignment of a plurality of electrical interconnections of the land grid array interposer onto a plurality of electrical interconnections of the electronic module;
   (e) means to apply a compressive load to the land grid array interposer mounted and aligned onto the electronic module;
   (f) means to protect the replaceable electronic assembly.

10. The replaceable electronic assembly of claim 9, wherein the means to mount the land grid array interposer onto the electronic module comprises at least one alignment pin integral with and extending from the land grid array interposer to fit into at least one interposer alignment hole of the module cap in said alignment means.

11. The replaceable electronic assembly of claim 10, wherein the mounting means further comprises at least one retaining clip to engage the at least one alignment pin into the at least one interposer alignment hole.

12. The replaceable electronic assembly of claim 9, wherein the means to apply a compressive load to the land grid array interposer mounted and aligned onto the electronic module further comprises a plurality of shimmed load posts located at or near a midpoint of each edge of and extending from the module cap upon which the electronic module is connected.

13. The replaceable electronic assembly of claim 12, wherein the means to protect the replaceable electronic assembly further comprises means to interconnect the heat transfer unit, the module cap, the electronic module, the land grid array interposer, and a removable cover into an integral unit.

14. The replaceable electronic assembly of claim 13, wherein the means to protect the replaceable electronic assembly further comprises a springplate mounted onto the removable cover to apply a preload to the land grid array interposer.

\* \* \* \* \*